United States Patent
Bigwood et al.

(10) Patent No.: US 7,470,492 B2
(45) Date of Patent: Dec. 30, 2008

(54) PROCESS WINDOW-BASED CORRECTION FOR PHOTOLITHOGRAPHY MASKS

(75) Inventors: Robert M. Bigwood, Hillsboro, OR (US); Shem Ogadhoh, Beaverton, OR (US); Joseph E. Brandenburg, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 895 days.

(21) Appl. No.: 10/977,421

(22) Filed: Oct. 29, 2004

(65) Prior Publication Data

US 2006/0095887 A1    May 4, 2006

(51) Int. Cl.
*G03F 9/00* (2006.01)
(52) U.S. Cl. .................. 430/30; 430/5; 716/19
(58) Field of Classification Search .............. 430/5, 430/30; 716/19
See application file for complete search history.

(56) References Cited

U.S. PATENT DOCUMENTS

| 7,266,801 B2 * | 9/2007 | Kotani et al. .......... 716/21 |
| 7,350,181 B2 * | 3/2008 | Tanaka et al. ......... 716/19 |
| 2008/0044748 A1 * | 2/2008 | Han et al. ............. 430/22 |

* cited by examiner

*Primary Examiner*—Christopher G Young
(74) *Attorney, Agent, or Firm*—Blakely, Sokoloff, Taylor & Zafman LLP

(57) ABSTRACT

A correction for photolithography masks used in semiconductor and micro electromechanical systems is described. The correction is based on process windows. In one example, the invention includes evaluating a segment of an idealized photolithography mask at a plurality of different possible process variable values to estimate a corresponding plurality of different photoresist edge positions, comparing the estimated edge positions to a minimum critical dimension, and moving the segment on the idealized photolithography mask if the estimated edge positions do not satisfy the minimum critical dimension.

20 Claims, 3 Drawing Sheets

PROCESS WINDOW-BASED CORRECTION FOR PHOTOLITHOGRAPHY MASKS

BACKGROUND

1. Field

The present description relates to photolithography of semiconductor and micro electromechanical systems and, in particular, to correcting photolithography masks.

2. Background

Semiconductor chips are typically made using a process of photolithography. In this process, a layer of photoresist is spun onto a semiconductor wafer or substrate as a single uniform layer. The wafer includes many dice. Each die is used to make a single chip. A light, for example a scanning laser, is projected onto the photoresist through a mask. The mask has a pattern that is projected onto the photoresist. This causes the photoresist to be illuminated only in certain parts corresponding to the pattern.

After exposure, the photoresist is developed so that only the exposed portions or unexposed portions, depending on the type of resist, remain. Layers of metal, silicon, oxides, and the like that have been uncovered when the photoresist is developed may then be etched away. The rest of the photoresist is then removed, leaving a pattern of the metal, silicon, oxide or other materials. By repeating the process of applying photoresist, exposing, developing, applying a material and removing the photoresist, complex circuitry or structures may be created.

The mask is typically formed of a glass quartz plate with a complex set of lines that form polygons on the surface of the plate. The lines may be made using a chromium layer, a MoSi layer or some other material. When a light shines on the mask, the pattern of polygons on the plate is projected onto the photoresist through an optical system.

The mask is designed based on a database that describes the features that are desired for the pattern on the mask. This database is used to create an initial mask pattern. However, the pattern on the mask may not match the actual pattern that will physically result after the pattern is projected onto photoresist on a wafer and then the photoresist is developed.

A variety of different distortions have been identified between the mask pattern and the resulting final wafer. These include line width variations, corner rounding, and line shortening. They also include an offset in the critical dimension (CD), the smallest feature size that can be successfully produced, between nested features and isolated features. Nested features are lines or spaces that are surrounded by or near other lines with similar sizes. Isolated features are lines or spaces that are separated from other features by a large distance.

Line width variations, as an example, can degrade the performance of a device or cause it to fail altogether. For example, line width variations in the patterning of gate layers can cause a transistor gate to be too large or too small. Larger gates slow down the transistor, while smaller gates may suffer from punch through, which ultimately will cause the gate to fail. One source of line width variations is an optical proximity effect which causes differences between nested and isolated features.

The distortions become more significant as more and more transistors and other devices are packed into each chip. The distortions also become more significant when strong off-axis illumination is used to expose the photoresist. Strong off-axis illumination has distinct advantages for very small nested features, however, it has disadvantages for isolated features. Optical proximity correction (OPC) is used to modify the mask in order to compensate for many of the distortions that result from printing a pattern on photoresist or from etching features on that pattern. The lithography model used in OPC is applied to the mask pattern point-by-point, modifying the mask and, in particular, the width of the chrome lines on the mask, until the simulated wafer pattern matches the theoretical ideal. However, this match using existing OPC models is not perfect.

OPC processes are based on sets of rules based on geometry and on models of the projection optics and photoresist systems. As an example, in cases where isolated features are too thin to be successfully produced on the wafer, these features are made larger. This change then affects every other nearby feature. In addition, the rules used to handle a mask become very complex by trying to handle the complex patterns of modern semiconductor systems and the ability of such features to be reproduced successfully. Some of the rules do not fully apply to complex two-dimensional geometries. For example, a given feature may appear to be nested according to geometric rules but will behave more like an isolated feature. The OPC will be misapplied and the mask will be inoperative or suffer reduced yield. Additional time is often required to test the mask and compensate for the weaknesses in the OPC model.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only.

DETAILED DESCRIPTION

Figure 1:
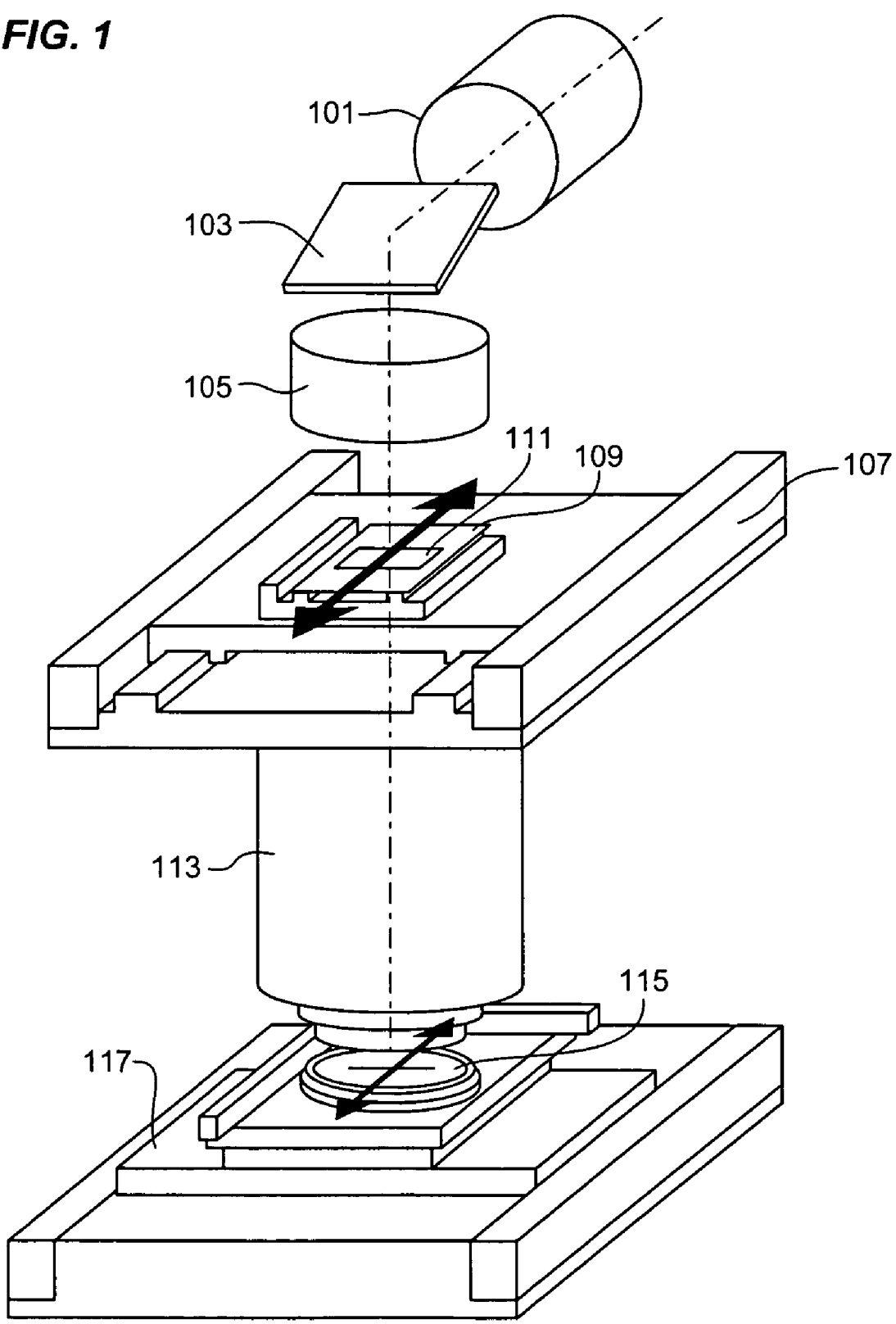
FIG. 1 is a diagram of a semiconductor fabrication device suitable for application to the present invention.

FIG. 1 shows a conventional semiconductor fabrication machine, in this case, a lens-scanning ArF Excimer Laser Stepper. The stepper may be enclosed in a sealed vacuum chamber (not shown) in which the pressure, temperature and environment may be precisely controlled. The stepper has an illumination system including a light source 101, such as an ArF excimer laser, a scanning mirror 103, and a lens system 105 to focus the laser light on the wafer. A reticle scanning stage 107 carries a reticle 109 which holds the mask 111. The light from the laser is transmitted onto the mask and the light transmitted through the mask is focused further by a projection lens with, for example, a four fold reduction of the mask pattern onto the wafer 115.

The wafer is mounted to a wafer scanning stage 117. The reticle scanning stage and the wafer scanning stage are synchronized to move the reticle and the wafer together across the field of view of the laser. In one example, the reticle and wafer move across the laser light in a thin line, then the laser steps down and the reticle and wafer move across the laser in another thin line until the entire surface of the reticle and wafer have been exposed to the laser. Such a step and repeat scanning system allows a high intensity narrow beam light source to illuminate the entire surface of the wafer. The stepper is controlled by a station controller (not shown) which may control the starting, stopping and speed of the stepper as well as the temperature, pressure and chemical makeup of the ambient environment, among other factors. The stepper of FIG. 1 is an example of a fabrication device that may benefit from embodiments of the present invention. Embodiments of the invention may also be applied to many other photolithography systems.

The mask controls the size of each feature on the wafer. The mask design is made up of chrome metal lines or lines of some other material of different widths and shapes designed to create a particular pattern on the wafer. When OPC (Optical Proximity Correction) is applied to the mask, the mask is modified iteratively, primarily by modifying the widths of the metal lines and adding decorations to corners, until the photolithography model predicts that the final wafer will match the intended target design. Then the physical model is used to adjust the chrome size on the mask to achieve the new desired size on the wafer.

The current point-by-point OPC model applies an iterative correction process to segments of the mask pattern. One version of the current process can be generalized to the following sequence of operations:

1) Calculating an intensity and development threshold at a point along a segment of a mask pattern. The intensity refers to the intensity of the light striking the wafer during exposure. The development threshold refers to the light intensity necessary to fully expose the photoresist. A segment is a portion of an edge of a polygon on the mask.
2) Evaluating the rate of change of intensity with movement of the chrome edge on the mask that corresponds to the segment. If, for example, the chrome line is made thicker or thinner, the amount of light that falls on the photoresist during exposure will be affected.
3) Estimating the amount and direction of chrome movement needed to bring the intensity to the threshold value. This is usually done by multiplying the desired intensity change by a geometrical and optical factor.
4) Applying the estimated movement to the point.
5) Adjusting other segments in the pattern.
6) Repeating the estimates and adjustments iteratively over the entire mask until all of the segments produce the desired result.

While OPC corrects some errors it does not correct all errors. Some features may have a very small process window as compared to other features, even though they appear to be the same size under idealized process conditions. These features may not be consistently reproduced using the final OPC adjusted mask through the full range of conditions likely to be experienced in a manufacturing environment.

A different mask correction process may be performed based on process window rather than intensity. The process window may be considered as the range of process variable values over which a feature will print satisfactorily on the wafer. Process variables may include exposure, focus, photoresist sensitivity, etching process conditions and more. The values of these process variables are typically controlled as precisely as possible, but there is a limit to how perfectly the values can be controlled. In order for the mask to work every time, even when the process variables change, it must be designed to accommodate the full process window.

The process variable values can change due to limitations in the precision of the exposure tool, such as the stepper of FIG. 1. For example, the stepper may be able to control the focus distance of its lens system only to within a particular range so that the wafer may not be perfectly focused. It may be able to control the speed of its motor only to a certain accuracy so that the light passes over some parts of the wafer more quickly than others. There may be variations in the printed wafer's thicknesses. Thickness variations may arise from the patterned layers that lie underneath the photoresist, from inconsistencies in the photoresist layer and from bends, curves or warpage in the silicon substrate that carries all of the layers. These variations may affect focus distance, exposure and other processes. There also may be limits in how precisely environmental conditions, such as temperature and pressure can be controlled and there may be impurities in some of the materials that are used. These are just some examples of variable that occur in the fabrication processes.

Satisfactory printing of a feature may be determined in different ways. Satisfaction may be measured based on the objective general performance of a feature, for example, the impact of the feature on yield or the tested performance of the corresponding circuit. It may be based on whether the feature shows a collapse of a line or a bridging of a space during burn-in. It may also be measured based on specific results, for example, whether a critical dimension of the feature stays within some distance or percentage of the intended value in the original design.

As mentioned above, all of the process variables have a range. The range through which a process variable changes may be referred to as a window. For example, there may be a focus window that indicates the range of variation in focus distance for a particular stepper configuration. The effect of any likely changes in the process variables within their respective windows may be estimated. These estimates may be applied to features on the mask to provide a range of feature sizes and shapes that can be reliably produced no matter what values the process variables take on within their respective windows. If all the mask features are reproducible across all process variable windows, then the mask features may be said to have adequate process window. Adequate process window for each feature on the mask will ensure that the feature may be reliably reproduced on the photoresist even as the process variables change. In other words, the mask will work well under all expected process conditions.

A process window-based mask correction process may be performed after the current OPC process, instead of the current OPC process or with other processes. This process window-based process may be used to evaluate the process window for every feature on the photo-mask. An iterative correction technique may be applied until all of the features are determined to have an adequate process window.

Figure 2:
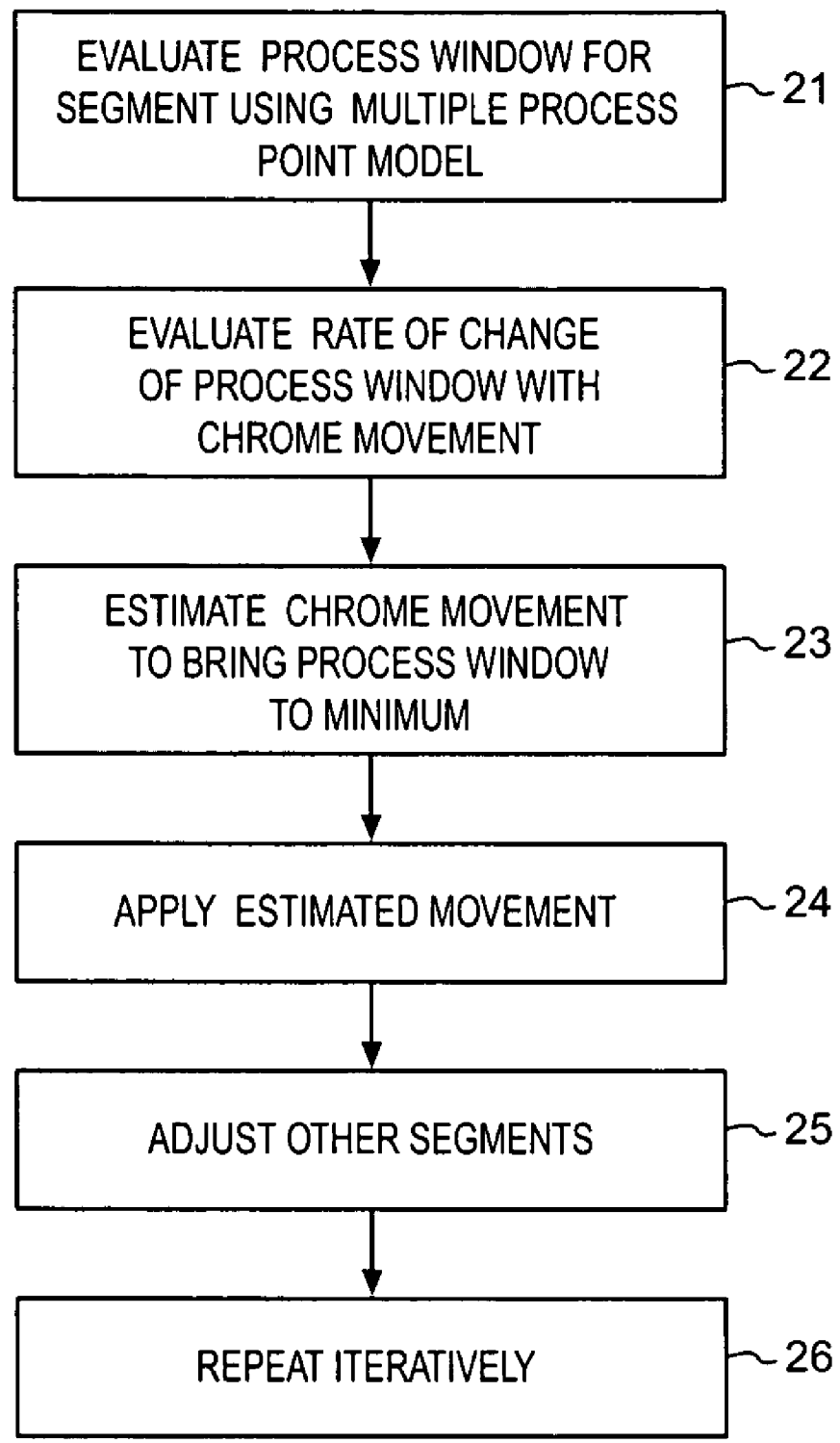
FIG. 2 is a process flow diagram or a process window-based mask correction according to an embodiment of the present invention.

The process window process may be generalized to a sequence of operations. These operations are shown in FIG. 2 and include:

1) Evaluating the process window for multiple points along a segment of a mask pattern using a multiple process point model. (block 21)
2) Evaluating the rate of change of process window with movement of the chrome edge on the mask that corresponds to the segment. (block 22)
3) Estimating the amount of chrome movement needed to bring the process window up to the minimum value. (block 23)

4) Applying the estimated movement to the segment. (block 24)

5) Adjusting other segments in the pattern. (block 25)

6) Repeating iteratively until all of the segments produce the desired result. (block 26)

As a result of this correction operation, the circuit features on the mask may be modified to ensure that all of the circuit features have adequate process window. The modifications are done without affecting features with adequate process window and without reducing overall yields in production.

The operations corresponding to items 4, 5, and 6 above are performed in a manner similar to OPC and have been well documented. The first three operations are performed in a different manner and are discussed in more detail below.

The evaluation of the process window may be done based on a process window model. This model may use the same design and structure as an OPC model but be calibrated for a process variable window rather than for a single process point. For example, a physical model may be used to assess the real process latitude for any particular pattern. As a physical model, the typical exceptions for geometrical models do not apply and the model may provide better results for a greater variety of different features. Avoiding exceptions such as those common in OPC reduces the amount of time required to develop a useful mask.

The process window model may be calibrated by creating a model script that simultaneously simulates multiple process points. Data from actual wafer measurements at multiple process points may then be compared to model predictions. To allow the model to act consistently for all types of features, all of the simulated process points may be required to use the same parameters, except for defocus and exposure threshold parameters. Although some variations of other parameters may be allowed to compensate for physical effects not included in the model. Also, special attention may be paid to matching the through process trends in the measured data.

Unlike the current single point OPC models, a process window model may use two or more process points. The process points each predict a resist edge position at different process variable values. The multiple point predictions improve the accuracy of the process window-based estimates. An example of using multiple process points is shown in FIG. 3.

Figure 3:
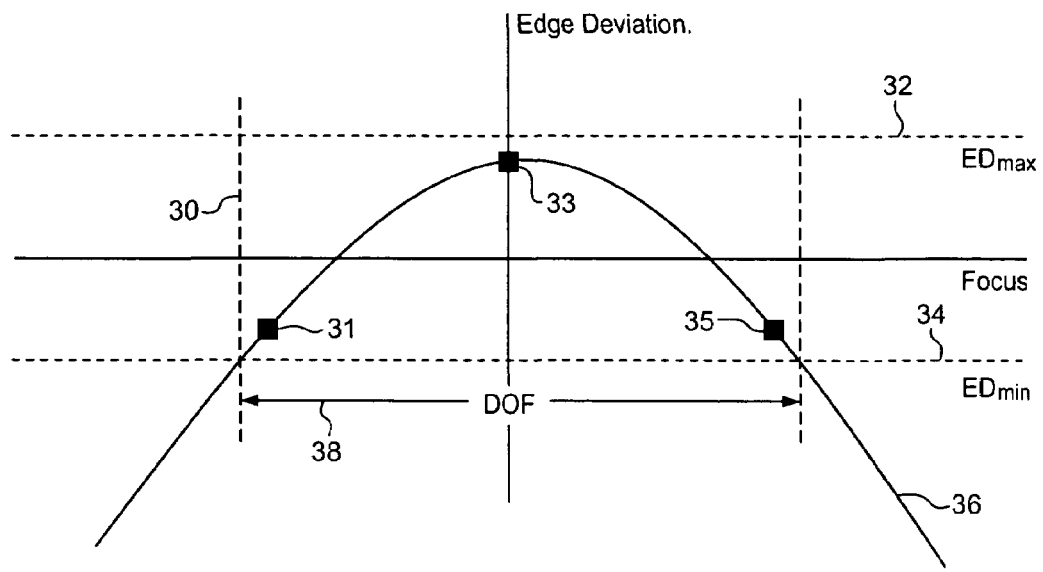
FIG. 3 is a graph of an example of measured process points plotted against a process variable window to derive a curve according to an embodiment of the present invention.

In FIG. 3, edge deviations on the vertical axis are plotted against the process range, in this case focus position, on the horizontal axis. While focus point is used for this example other process variables may be handled in a similar way including intensity, image slope, resist development threshold, edge deviation, drawn line or space width, etc. At the origin, the edge is at exactly the intended design position and the focus point is exactly on the surface of the photoresist. Movement up or down the vertical axis reflects edge positions on the developed photoresist or ultimate structure that differ from the intended position based on the circuit design. The maximum 32 and minimum 34 allowable edge deviations are shown as upper and lower boundaries on the vertical axis. Movement to the left and right of perfect focus reflect movement of the actual focus point created by the stepper above or below the surface of the photoresist. This affects how the lines are projected on the photoresist. In this case it affects the actual positions of the lines on the photoresist.

In FIG. 3, a process variable window 30 for focus position is generated based on predicted edge position of developed photoresist. The prediction is based on a calculation of the resist edge position at three different focus points 31, 33, 35. More points may be used to suit a particular application. While in the example of FIG. 3, the process points refers to a specific combination of focus and exposure dose (controlled by the mask features), other variables may be included or treated separately. Such process variables may include resist thickness, substrate layer thickness, higher order lens aberrations, etc.

As shown in FIG. 3, a second order polynomial 36 may then be drawn through those three points. This curve may be used to approximate edge deviation as a function of focus point, a key factor in operation block 22. The curve is extended so that it passes through either the maximum or the minimum allowable edge deviation at both ends. In the example of FIG. 3, the curve only passes through the minimum edge deviation boundary 34. The process variable (focus) window is determined by calculating the focus points at which the curve crosses the limits of acceptable resist edge position 32, 34 and then measuring the distance 38 between them. In the example of FIG. 3, this distance 38 is labeled DOF (Depth of Field) and defines the focus window for the illustrated feature.

The maximum and minimum allowable edge deviations may be determined in many different ways. One way may be referred to as setting proportional limits. For proportional limits, the maximum allowed deviation in the edge projected onto the photoresist from the original edge on the mask is directly proportional to the width of the line or space on the mask.

For the proportional approach, the maximum edge deviation may be expressed as:

$$EDmax = c(DrawnCD)$$

where EDmax is the maximum allowed deviation of the edge on the photoresist, c is an empirically derived constant and DrawnCD is the width of the line or space on the mask that is being analyzed. For the example of FIG. 3, the constant may be determined by exposing photoresist in the stepper with a variety of different line widths and focus points and then measuring the results. The results may be measured after the photoresist is exposed, after it is developed or the measurement may be based on measurements of the semiconductor elements that result after the photoresist is removed. The minimum edge deviation may be determined in the same way.

Another way to determine the allowable edge deviation is to establish a minimum critical dimension (CD) or floor CD. For the floor CD approach, the floor CD may be regarded as the critical dimension for a prototypical feature below which the photolithography process is not sustainable.

For the floor CD approach, the maximum edge deviation may be expressed as:

$$EDmax = \tfrac{1}{2}(DrawnCD - FloorCD)$$

where the floor CD is empirically chosen, and may be driven by factors that are difficult for the physical model to predict, such as resist line collapse, incomplete development of resist from spaces between lines, resist line height reduction due to partial exposure in nominally unexposed regions, performance cliffs for the etch process, etc. The limit of acceptable edge deviation is determined by comparing drawn line and space widths to the floor CD.

A theoretical or mathematical process may be substituted for the empirical process described with respect to FIG. 3. In either case, such a process, by deriving a curve 36 determines the process window for any particular variable.

Figure 4:
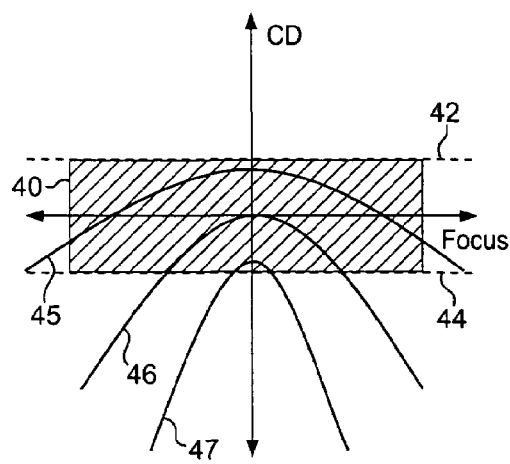
FIG. 4 is a graph of a set of curves corresponding to different chrome widths for an isolated feature against a process window according to an embodiment of the present invention.
Figure 5:
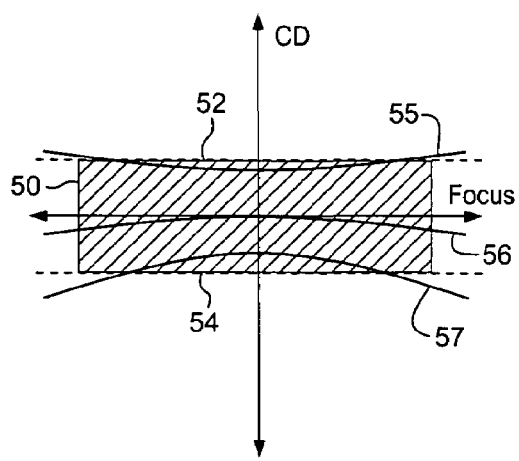
FIG. 5 is a graph of a set of curves corresponding to different chrome widths for a nested feature against a process window according to an embodiment of the present invention.

FIGS. 4 and 5 show an example of a critical dimension (CD) of a developed photoresist edge varying with changes in focus. As can be seen by comparing FIG. 4 which shows an example of an isolated line to FIG. 5 which shows an example of a nested line, different types of features respond to focus changes differently. The axes of FIGS. 4 and 5 are similar to those of FIG. 3 and so is the focus window 40, 50. However, in FIGS. 4 and 5, three different process window curves 45, 46, 47, 55, 56, 57 are shown to illustrate the effects of changes in the width of lines on a mask.

CD's of a nested line on a photoresist mask and of an isolated line on a photoresist mask vary through changes in the focus point in the same way as shown in FIG. 3. Each curve represents the CD as it changes from the idealized center axis through changes in focus point on the horizontal axis. Each curve represents a different chrome width. These curves may be obtained empirically as described above with respect to FIG. 3, or theoretically. The middle curve 46, 56 represents the nominal width. It corresponds to the chrome width required to print the desired CD on the wafer. The nominal chrome size is a curve that might result from adjusting a mask based on a traditional OPC, and it is not necessarily the same for the nested and isolated features.

For a feature to have acceptable process window, it's CD curve should remain inside the horizontal sides of the process window box through the focus range defined by the vertical sides of the box. In other words, the curves should exit the process window 40, 50 through the vertical sides as shown by one of the curves 45, 56 in each figure.

As shown by the example curves of FIGS. 4 and 5, the effect of mask line width for isolated features is different than for nested features. The CD varies much more rapidly through focus for the isolated feature than for the nested feature. This may occur especially with processes that make heavy demands of the ultimate pitch resolution, which is the case for most low level metal patterns, and, to some extent, contact and via patterns. Off-axis illumination increases the distinction still more. The particular shape of the curves of FIGS. 4 and 5 will depend upon the proximity of nearby lines on the mask as well as a variety of different process variables. The curves shown in FIGS. 3, 4, and 5 are provided as illustrations of possible curves that may be developed.

As shown by the central curves 46, 56 of FIGS. 4 and 5, even though both nested and isolated features will print to the desired size at the center focus position (i.e. if focus is perfect), the curve 46 for the isolated feature crosses the horizontal line corresponding to the minimum allowable CD before the expected focus range is reached. This isolated feature will not print satisfactorily unless the focus distance can be maintained to an unavailable high level of precision. The isolated feature does not meet the process window requirements. The nominal curve 56 for the nested feature, however, is much flatter, and it does have adequate process window.

For the isolated feature of FIG. 4, the chrome size may be increased to that shown by the upper curve 45. This provides an upward translation of the CD curve and also a flattening of the curvature. The combination of those two changes results in a dramatic increase in the process window, to the extent that it now satisfies the requirements. Conversely, a decrease in chrome size to the lower curve 47 causes a downward translation and increase in curvature, and a resultant collapse of process window.

Looking at the nested feature on the other hand, the nominal chrome width determined through OPC meets the process window. The two illustrated curves for an increase and a decrease in the chrome size show translation and curvature changes that actually decrease the process window below what is desired.

A set of curves such as those shown in FIGS. 4 and 5 may be used to estimate the amount of chrome movement necessary to bring the process window up to the minimum value. The desired increase in process window (estimated amount subtracted from minimum process window) may be multiplied by a factor that relates to the change in process window as a function of the chrome movement. The factor may be based on the slope of the curves.

The curves also allow the changes to be limited to those features that require a change. Features such as those represented by FIG. 5 can be left alone. By applying such adjustments to each segment of the mask and then going through the mask again iteratively to double check the effects of the changes, a more reliable mask is generated.

The particular curves, process variables, fabrication systems, and feature configurations shown are provided as examples of embodiments of the present invention. Focus position is shown for illustration purposes, while embodiments of the invention may be applied to a wide range of different process variables and combinations of process variables. Embodiments of the present invention may be applied to many different types of semiconductor wafers and micro electromechanical chips in many different configurations.

Embodiment of the present invention may be provided as a computer program product which may include a machine-readable medium having stored thereon instructions which may be used to program a general purpose computer, mode distribution logic, memory controller or other electronic devices to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other types of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection).

It is to be appreciated that a lesser or more process variable, process window model, correction process, or critical dimension model. Therefore, the configurations may vary from implementation to implementation depending upon numerous factors, such as price constraints, performance requirements, technological improvements, or other circumstances. Embodiments of the invention may also be applied to other types of systems that use different devices than those shown in the Figures.

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A method comprising:
    evaluating a process variable window for a segment of a pattern on an idealized photoresist mask;
    estimating an amount of movement of the segment to bring the segment within the process variable window;
    moving the segment on the idealized photoresist mask based on the estimate; and
    repeating evaluating, estimating and moving for additional segments of the idealized photoresist mask.

2. The method of claim 1, wherein evaluating comprises predicting a range of positions of a photoresist edge from the segment through possible values of the process variable.

3. The method of claim 2, wherein possible values of the process variable comprise focus positions within a margin of error of a photolithography optical system.

4. The method of claim 1, wherein the process variable window comprises a range of process variable values over which the segment will print satisfactorily on a photoresist through photolithography.

5. The method of claim 1, wherein estimating an amount of movement comprises evaluating a rate of change of the process window variable with movement of the segment and applying the rate of change to estimate the amount of movement.

6. The method of claim 1, further comprising iteratively repeating evaluating, estimating and moving for all of the segments of the mask.

7. The method of claim 1, wherein evaluating a process variable window comprises determining whether the segment will print satisfactorily on a photoresist through photolithography and wherein estimating and moving comprise estimating and moving only if the segment will not print satisfactorily on a photoresist through photolithography.

8. A method comprising:
    evaluating a segment of an idealized photolithography mask at a plurality of different possible process variable values to estimate a corresponding plurality of different photoresist edge positions;
    comparing the estimated edge positions to a minimum critical dimension; and
    moving the segment on the idealized photolithography mask if the estimated edge positions do not satisfy the minimum critical dimension.

9. The method of claim 8, wherein estimating a plurality of different photoresist edge positions comprises estimating a range of photoresist edge positions over all possible process variable values.

10. The method of claim 8, wherein estimating a plurality of different photoresist edge positions comprises drawing a polynomial curve through a set of estimated process points, the curve extending over all possible process variable values.

11. The method of claim 8, wherein the different possible variable values correspond to a process variable window.

12. The method of claim 8, wherein the process variable comprises focus position.

13. The method of claim 8, wherein the minimum critical dimension is defined as a proportion of an idealized dimension designed to be produced by the idealized photolithography mask.

14. The method of claim 8, wherein moving comprises:
    determining a maximum of a difference between the estimated edge positions and the minimum critical dimension;
    estimating an amount of movement of the segment corresponding to the determined maximum; and
    moving the segment on the idealized photoresist mask based on the estimate.

15. The method of claim 14, further comprising iteratively repeating evaluating, comparing and moving for all the segments of the mask.

16. An article comprising a machine readable medium including data that when accessed by a machine causes the machine to perform operations comprising:
    evaluating a segment of an idealized photolithography mask at a plurality of different possible process variable values to estimate a corresponding plurality of different photoresist edge positions;
    comparing the estimated edge positions to a minimum critical dimension; and
    moving the segment on the idealized photolithography mask if the estimated edge positions do not satisfy the minimum critical dimension.

17. The article of claim 16, wherein estimating a plurality of different photoresist edge positions comprises estimating a range of photoresist edge positions over all possible process variable values.

18. The article of claim 16, wherein the data causing the machine to perform further operations comprising estimating a plurality of different photoresist edge positions comprise data causing the machine to perform further operations comprising drawing a polynomial curve through a set of estimated process points, the curve extending over all possible process variable values.

19. The article of claim 16, wherein the different possible variable values correspond to a process variable window.

20. The article of claim 16, wherein the minimum critical dimension is defined as a physical dimension on a processed wafer below which the photolithography process is not sustainable.

* * * * *